United States Patent
Furuse et al.

(10) Patent No.: US 6,586,155 B2
(45) Date of Patent: Jul. 1, 2003

(54) COMPOSITION FOR FORMING ELECTROCONDUCTIVE FILM

(75) Inventors: Tsuyoshi Furuse, Atsugi (JP); Masahiro Terada, Hadano (JP); Shosei Mori, Hiratsuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 129 days.

(21) Appl. No.: 09/777,842

(22) Filed: Feb. 7, 2001

(65) Prior Publication Data

US 2002/0012868 A1 Jan. 31, 2002

(30) Foreign Application Priority Data

Feb. 8, 2000 (JP) ........................ 2000-030440
Jan. 30, 2001 (JP) ........................ 2001-021030

(51) Int. Cl.$^7$ .................... G03F 7/038; G03F 7/40; G03F 7/30
(52) U.S. Cl. ................ 430/270.1; 430/330; 430/311; 430/909; 430/905; 438/99
(58) Field of Search .................. 430/270.1, 330, 430/311, 905, 909; 427/552; 438/99, 636, 793, 794, 976

(56) References Cited

U.S. PATENT DOCUMENTS

| 5,637,440 A | 6/1997 | Ogi et al. ................ 430/270.1 |
| 5,824,456 A | 10/1998 | Ogi et al. .................... 430/325 |
| 5,831,387 A | 11/1998 | Kaneko et al. ............. 313/495 |
| 5,996,488 A | 12/1999 | Yanagisawa et al. ........ 101/170 |
| 6,087,770 A | 7/2000 | Kaneko et al. ............. 313/495 |
| 6,106,906 A | 8/2000 | Matsuda et al. ............. 427/558 |
| 6,113,448 A | 9/2000 | Kobayashi et al. ........... 445/24 |
| 6,123,876 A * | 9/2000 | Kobayashi et al. ......... 252/512 |
| 6,137,218 A | 10/2000 | Kaneko et al. ............. 313/495 |
| 6,336,015 B1 * | 1/2002 | Numagami .................. 399/104 |

FOREIGN PATENT DOCUMENTS

| EP | 0 714 113 A1 | 5/1996 |
| JP | 5-114504 | 5/1993 |
| JP | 8-176177 | 7/1996 |
| JP | 8-185818 | 7/1996 |
| JP | 8-236017 | 9/1996 |
| KR | 10-0200259 | 3/1999 |
| KR | 10-0221215 | 6/1999 |

* cited by examiner

Primary Examiner—Janet Baxter
Assistant Examiner—Yvette C. Thornton
(74) Attorney, Agent, or Firm—Fitzpatrick, Cella, Harper & Scinto

(57) ABSTRACT

The invention is to enable easy formation of a fine electroconductive film pattern with a composition utilizing aqueous solvent of easy handling and little environmental burden.

An electroconductive film forming composition composed of a water-soluble photosensitive resinous component, a water-soluble organometallic compound component capable of forming an electroconductive film by baking, and an aqueous solvent component is coated on a substrate and, after exposure based on the necessary pattern of the electroconductive film and development, is baked to form the required electroconductive film.

19 Claims, 2 Drawing Sheets

COMPOSITION FOR FORMING ELECTROCONDUCTIVE FILM

BACKGROUND OF THE INVENTION

1. Field of the Invention

The present invention relates to a composition for forming an electroconductive film such as an electrode or a wiring, a method for forming an electroconductive film such as an electrode or a wiring utilizing such composition, and a method for producing an image forming apparatus utilizing such composition and/or method.

2. Related Background Art

For forming a pattern of an electroconductive film such as an electrode or a wiring on a substrate, there have been known, for example, (1) a method of coating paste, containing an electroconductive material, on a substrate by screen printing method and drying and baking such paste (Japanese Patent Application Laid-Open No. 8-185818 etc.), (2) a transfer method (offset printing method) (Japanese Patent Application Laid-Open No. 8-236017 etc.), (3) a method of coating the entire surface of a substrate with metal-containing solution, then drying and baking such solution to form a metal film, covering a specified area with a mask such as photoresist and removing the metal film by etching in the area not covered by the mask, and (4) a method of adding a photosensitive material to metal-containing paste, then exposing a desired portion to light and executing development thereby forming a pattern of the electroconductive film (Japanese Patent Application Laid-Open Nos. 5-114504 and 8-176177).

SUMMARY OF THE INVENTION

However, the above-mentioned method (1) is difficult to apply to a fine pattern, and the method (2) is insufficient in the uniformity and reproducibility of the film thickness. Also the method (3) requires the use of a strong acid for etching particularly in case the pattern is composed of a noble metal such as platinum, and a fine circuit is difficult to form because the resist material is attached or the insulating substrate is eroded. Also the method (4), involving the use of organic solvent, requires an explosion-proof facility for coating, drying and baking steps and extensive care in the handling of the chemicals, and there is involved a significant environmental burden because a large amount of chlorine-containing organic solvent is used also in the development step.

In consideration of the foregoing, the object of the present invention is to enable easy formation of a pattern of an electroconductive film such as a fine electrode, a fine wiring and the like with a composition utilizing aqueous solvent easy to handle and posing little environmental burden.

According to a first aspect of the present invention, a composition for forming an electroconductive film comprising a water-soluble photosensitive resinous component, a water-soluble organometallic compound component capable of forming an electroconductive film by baking, and an aqueous solvent component is provided.

The above-mentioned first aspect includes, as preferred embodiments thereof, that the water content in the aforementioned aqueous solvent component is 70 wt. % or more;

the water content in the aforementioned aqueous solvent component is 90 wt. % or more;

the aforementioned aqueous solvent component is solely composed of water;

the aforementioned organometallic component is a platinum complex;

the aforementioned organometallic component is a metal complex of which ligand is a nitrogen-containing compound having at least a hydroxyl group in the molecule;

the aforementioned nitrogen-containing compound having at least a hydroxyl group in the molecule is a nitrogen-containing compound having eight or less carbon atoms;

the aforementioned photosensitive resinous component is insolubilized in developing liquid by light irradiation; and the aforementioned photosensitive resinous component is solubilized in developing liquid by light irradiation.

A second aspect of the present invention relates to a method utilizing the aforementioned composition for forming an electroconductive film, such as an electrode or a wiring, of the first aspect employing the photosensitive resinous component of a type insolubilized in the developing liquid by light irradiation. And, the second aspect is to provide a method for forming an electroconductive film comprising a coating step of coating the electroconductive film forming composition on the surface of a substrate, a drying step of drying the coated film of the aforementioned composition, an exposure step of exposing the coated film to a predetermined pattern, a development step of removing the non-exposed portion of the coated film, and a baking step of baking the remaining exposed portion of the coated film.

A third aspect of the present invention relates to a method utilizing the composition of the first invention employing the photosensitive resinous component of a type solubilized in the developing liquid by light irradiation. And, the third aspect is to provide a method for forming an electroconductive film comprising a coating step of coating the composition on the surface of a substrate, a drying step of drying the coated film of the composition, an exposure step of exposing the coated film to a predetermined pattern, a development step of removing the exposed portion of the coated film, and a baking step of baking the remaining non-exposed portion of the coated film.

The above-mentioned second and third aspects include, as preferred embodiments thereof, that the aforementioned coating step is a step executed by a method selected from the spin coating method, immersion coating method, spray coating method, stamp coating method, roller coating method, slit coating method and ink jet coating method;

the aforementioned coating step is a step employing ink jet coating method; and the aforementioned coating step is a step employing screen printing method, offset printing method or flexo printing method.

A fourth aspect of the present invention is to provide a method for producing an image forming apparatus provided with plural electron emitting devices and an image forming member for forming an image by the irradiation with electron beams emitted from the electron emitting devices, wherein an electrode and/or a wiring to be employed in the aforementioned image forming apparatus is prepared by the method of the second or third aspect.

Figure 1:
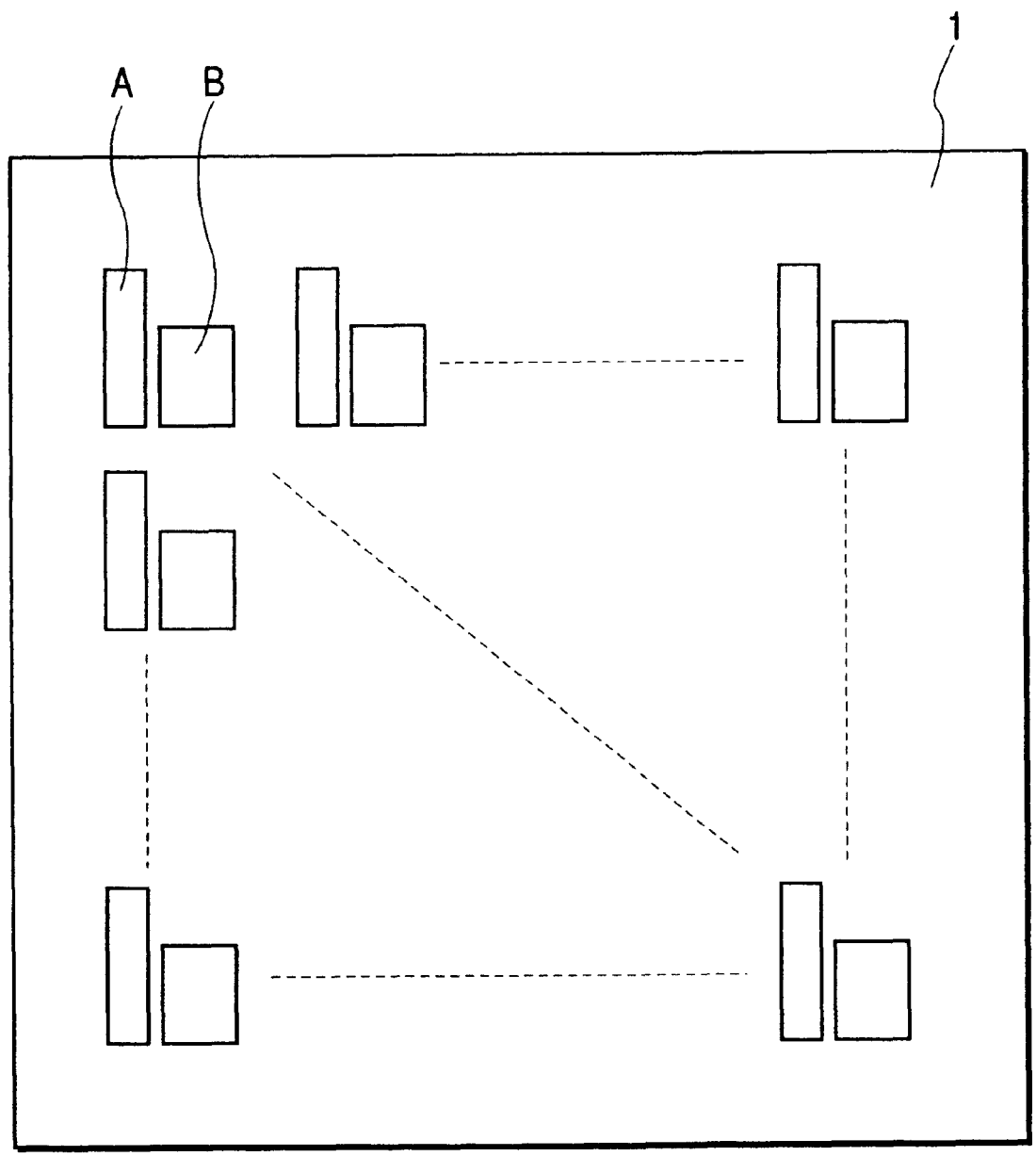
FIG. 1 is a schematic view of an electrode pattern formed according to an example 5.

DETAILED DESCRIPTION OF THE PREFERRED EMBODIMENTS (1) Composition for Forming an Electroconductive Film Such as Electrode or Wiring The photosensitive resinous component to be employed in the present invention can be any water-soluble resinous substance, but there is preferably selected a substance that is less prone to generate precipitate or to cause gelation by reaction with other components constituting the electroconductive film forming composition of the present invention.

The photosensitive resinous component can be of a type having a photosensitive radical in the resin structure or a type containing a photosensitive agent mixed in the resin as in the case of a cyclized rubber-bisazide resist. In the photosensitive resinous component of either type, there may be suitably mixed a photoreaction initiator or a photoreaction inhibitor.

The photosensitive resinous component to be employed in the present invention preferably employs water-soluble resin such as polyvinyl alcohol resin or polyvinylpyrrolidone resin because satisfactory water solubility can be easily obtained. Also it may be, after being dissolved in aqueous solvent to be explained later, then coated and dried, of a type in which a coated film soluble in the developing liquid is insolubilized by light irradiation (negative working type) or a type in which a coated film insoluble in the developing liquid is solubilized by light irradiation (positive working type).

The water-soluble organometallic compound capable of forming an electroconductive film such as a metal film by baking can be, for example, a complex compound of gold, platinum, silver, palladium or copper. Among these, a complex of platinum is particularly advantageously employed since there can be easily obtained an electrode and/or a wiring that is extremely stable chemically.

There is preferred a complex compound of which a ligand consists of a nitrogen-containing compound having at least a hydroxyl group within the molecule. Also among the complex compounds of which the ligand consists of the nitrogen-containing compound having at least a hydroxyl group within the molecule, there is more preferred a complex compound of which the ligand consists of one or plural nitrogen-containing compounds with eight or less carbon atoms, for example, an alcoholamine such as ethanolamine, popanolamine, isopropanolamine, butanolamine and the like, cerinol or TRIS (tris(hydroxymethyl)aminomethane).

The above-mentioned complex compounds can be advantageously employed because of high solubility in water and low crystallizing property. For example, the commercially available ammine complex compounds may inhibit formation of a uniform film, because of crystal precipitation during the drying. Also a "flexible" ligand such as a aliphatic alkylamine allows to reduce the crystallizing property, but the hydrophobic nature of the alkyl group may reduce the solubility in water. On the other hand, the above-described ligand allows to obtain the high solubility in water and the low crystallizing property at the same time.

Further, in order to improve the film quality of the obtained pattern of the electroconductive film and the adhesion to the substrate, there may be added a compound for example of rhodium, bismuth, ruthenium, vanadium, chromium, tin, lead or silicon.

In the present invention, the aqueous solvent means a solvent containing water by at least 50 wt. %. The aqueous solvent may contain, within an extent not exceeding 50 wt. %, a lower alcohol such as methyl alcohol, ethyl alcohol and the like in order to increase the drying speed or a component for accelerating the dissolution or improving the stability of the aforementioned photosensitive resinous component and organometallic compound component. However, from the standpoint of reducing the environmental burden, the aqueous solvent preferably has a water content of 70 wt. % or higher, more preferably 90 wt. % or higher, and most preferably consists solely of water.

The composition of the present invention for forming the electroconductive film such as an electrode, a wiring and the like is formed by dissolving the aforementioned photosensitive resinous component and organometallic compound component in the above-mentioned aqueous solvent, and the proportions of these components can be determined in consideration of the ease of coating, ease of patterning, uniformity of the obtained electroconductive film, controllability of thickness etc.

(2) Method for Forming the Electroconductive Film Such as Electrode or Wiring

The formation of an electrode and/or a wiring with a composition for forming the aforementioned electroconductive film can be achieved through a coating step, a drying step, an exposure step, a development step and a baking step, as explained below.

The coating step is to coat a composition for forming the electroconductive film of the present invention on a substrate. The coating can be achieved by various printing methods (screen printing method, offset printing method, flexo printing method etc.), spinner coating method, dip coating method, spray coating method, stamp coating method, roller coating method, slit coating method, ink jet coating method, etc. Among these, the aforementioned composition is most suited for the ink jet coating method (an ink for ink jet). Also there is advantageously employed the ink jet coating method utilizing a multi-type head in which plural ink jet heads are arranged.

The drying step is to evaporate the aqueous solvent in the coated film of the electroconductive film forming composition, coated on the substrate in the afore-described coating step, thereby drying the coated film. The drying of the coated film can be executed at the room temperature, but is preferably executed under heating, in order to reduce the drying time. The heated drying may be executed for example in an oven without air blowing, a drying machine or a hot plate. The drying can be achieved in general by placing the coated film at a temperature of 50° C. to 100° C. for 1 to 30 minutes, though such conditions are variable depending on the content of the coated composition and the coating amount thereof.

The exposure step is to expose the coated film, dried in the above-described drying step on the substrate, to the light of a predetermined pattern. The area of exposure by light irradiation in the exposure step is dependent on whether the photosensitive resinous component in the used composition is either a negative working type or a positive working type. In case of the negative type which is insolubilized in the developing liquid by light irradiation, an area to form the electroconductive film (electrode and/or wiring) is exposed to the light irradiation, but, in case of the positive type which is solubilized in the developing liquid by light irradiation, an area excluding the area for forming the electroconductive film (electrode and/or wiring) is exposed to the light irradiation. The selection of the light irradiation area and the light non-irradiation area can be achieved in a similar manner as in the mask formation with the ordinary photoresist.

The development step is to remove, in the coated film exposed to light in the above-described exposure step, the coated film in an area excluding the area required for forming the desired electroconductive film (electrode and/or wiring). In case the photosensitive resinous component is negative working type, the coated film not subjected to light irradiation is soluble in the developing liquid while the coated film subjected to light irradiation is insolubilized in the developing liquid, so that the development can be achieved by dissolving and removing, with the developing liquid, the coated film of the non-irradiated portion which is not insolubilized in the developing liquid. Also in case the photosensitive resinous component is positive working type, the coated film not subjected to light irradiation is insoluble in the developing liquid while the coated film subjected to light irradiation is solubilized in the developing liquid, so that the development can be achieved by dissolving and removing, with the developing liquid, the coated film in the irradiated portion which is solubilized in the developing liquid.

The developing liquid can be, for example, water or similar to the developing solution employed for the ordinary water-soluble photoresist.

The baking step is to bake the coated remaining on the substrate after the afore-described development step (coated film of the irradiated portion in the negative type or that of the non-irradiated portion in the positive type), and to eliminate the organic component in the coated film by decomposition, thereby forming an electroconductive film containing the metal which is contained as the organometallic compound component. The baking can be executed in the atmosphere in case the electroconductive film to be formed is a metal film of a noble metal, but can also be executed in vacuum or in an atmosphere free from oxygen (for example atmosphere of inert gas such as nitrogen) in case the electroconductive film is a metal film of an easily oxidized metal such as copper or palladium. The baking can be ordinarily executed by placing the coated film at a temperature of 400° C. to 600° C. for several minutes to several tens of minutes, though these conditions are variable for example depending on the kind of the organic component contained in the coated film. The baking can be achieved for example in a hot air circulation oven. Such baking allows to form a predetermined pattern of the electroconductive film such as an electrode and/or a wiring on the substrate.

(3) Method for Producing an Image Forming Apparatus

The above-described method of the present invention for forming the electroconductive film (electrode and/or wiring) can be advantageously applied to the method for producing an image forming apparatus comprising plural electron emitting devices and an image forming member for forming an image by the irradiation of the electron beams emitted from the electron emitting devices. More specifically, the producing process can be significantly simplified by forming the electroconductive film, such as electrodes and wirings employed in the image forming apparatus by the forming method of the present invention.

The electron emitting device to be employed in the image forming apparatus to be produced is preferably a cold cathode device such as a surface conduction electron emitting device, a field emission (FE) type electron emitting device, a metal/insulator/metal (MIM) type electron emitting device and the like, and, among these, there is particularly preferred the surface conduction type electron emitting device for which the device electrodes can be formed at a time by the forming method of the present invention. Also the forming method of the present invention allows to form the wirings required for driving the electron emitting devices, simultaneous with the formation of the device electrodes.

The image forming apparatus in the present invention includes, for example, a television receiver, a computer display and other apparatus such as a printer, a copying apparatus and the like. For example, in case of a television receiver or a computer display, the image forming member can be a phosphor which emits light by irradiation with an electron beam. Also in case of a printer or a copying apparatus, the image forming member can be a latent image forming member for forming a latent image by irradiation with a electron beam.

EXAMPLES

In the following, the present invention will be clarified further by examples, but the present invention is not limited by such examples.

Example 1

A composition 1-A was prepared by mixing aqueous solution of an organometallic compound (acetic acid tetrakis (monoethanolamine)platinum(II) complex, platinum content 5 wt. %) and aqueous solution of resin (polyvinyl alcohol) containing a photosensitive agent (sodium 4, 4'-diazidestylbene-2, 2'-disulfonate) with the following ratio:

| | |
|---|---|
| organometallic compound | 50 parts by weight |
| resin | 50 parts by weight (containing photosensitive agent by 10 parts by weight) |

The composition 1-A was coated, with a spin coater, on the entire surface of a glass substrate (75 mm×75 mm×2.8 mm in thickness) and was dried at 80° C. for 2 minutes on a hot plate to obtain a coated film with a thickness of 1.34 μm after drying.

Then the above-described coated film was exposed to the light for an exposure time of 30 seconds, with a negative photomask at a gap of 30 μm, utilizing an ultra high pressure mercury lamp (illumination intensity: 8.0 mW/cm$^2$) as the light source. After the exposure, the coated film was processed for 30 seconds by dipping in developed liquid consisting of deionized water, thereby providing a coated film patterned in the desired shape.

The substrate bearing the above-described patterned coated film was placed in a hot air circulating oven and baked for 30 minutes at 500° C., whereby pairs of platinum electrodes, each having a distance of 20 μm between the electrodes, a width of 60 μm, a length of 120 μm and a thickness of 49 nm, could be formed in 100×100 pairs with a pitch of 500 μm. Also the sheet resistance was 20 Ω/□, measured on a simultaneously prepared platinum film pattern of 1 cm×1 cm.

Example 2

A composition 2-A was prepared in the same manner as in the example 1 except that the organometallic compound was replaced by acetic acid tetrakis(monoethanolamino) platinum(II) complex (platinum content 5 wt. %) and that the resin was replaced by polyvinylpyrrolidone.

The composition 2-A was coated, with a spin coater, on the entire surface of a glass substrate (75 mm×75 mm×2.8 mm in thickness) and was dried at 80° C. for 2 minutes on a hot plate to obtain a coated film with a thickness of 1.52 μm after drying.

Then the above-described coated film was exposed to the light for an exposure time of 15 seconds, with a positive photomask at a gap of 30 μm, utilizing an ultra high pressure mercury lamp (illumination intensity: 8.0 mW/cm$^2$) as the light source. After the exposure, the coated film was processed for 15 seconds by dipping in developed liquid consisting of deionized water, thereby providing a coated film patterned in the desired shape.

The substrate bearing the above-described patterned coated film was placed in a hot air circulating oven and baked for 30 minutes at 500° C., whereby pairs of platinum electrodes, each having a distance of 20 μm between the electrodes, a width of 60 μm, a length of 120 μm and a thickness of 53 nm, could be formed in 100×100 pairs with a pitch of 500 μm. Also the sheet resistance was 22 Ω/□, measured on a simultaneously prepared platinum film pattern of 1 cm×1 cm.

Example 3

A composition 1-B was prepared in the same manner as in the example 1 except that the organometallic compound was replaced by acetic acid tetraammine platinum(II) complex.

The composition 1-B was coated, with a spin coater, on the entire surface of a glass substrate (75 mm×75 mm×2.8 mm in thickness) and was dried at 80° C. for 2 minutes on a hot plate. Satisfactory characteristics were obtained also in the electrodes prepared in the present example.

Example 4

A composition 2-B as prepared in the same manner as in the example 2 except that the organometallic compound was replaced by acetic acid tetraammine platinum(II) complex.

The composition 2-B was coated, with a spin coater, on the entire surface of a glass substrate (75 mm×75 mm×2.8 mm in thickness) and was dried at 80° C. for 2 minutes on a hot plate. Satisfactory characteristics were obtained also in the electrodes prepared in the present example.

Example 5

An image forming apparatus schematically shown in FIG. 1 was produced utilizing the electrode/wiring forming method of the present invention. The producing steps will be explained in the following with reference to FIGS. 1 and 2.

Step 1: On a glass substrate of 300 mm×300 mm×2.8 mm in thickness, a plurality of paired device electrodes were prepared by a process similar to that in the example 1.

In the present example, the pair of device electrodes (A, B) was composed of a device electrode A of a width of 60 μm and a length of 480 μm and a device electrode B of a width of 120 μm and a length of 200 μm, mutually opposed with an electrode gap of 20 μm. The pitch of the pairs of the device electrodes was selected as 300 μm in the lateral direction and 650 μm in the vertical direction, and the pairs of the device electrodes were arranged in a matrix of 720 pairs in the vertical direction by 240 pairs in the lateral direction. A platinum film pattern of 1 cm×1 cm, prepared simultaneously with the formation of the device electrodes, had a sheet resistance of 21 Ω/□.

Step 2: X-direction wirings 2, each connecting the device electrodes A of the paired device electrodes of each column, were added by screen printing method. Then an interlayer insulation layer of a thickness of 20 μm (omitted in the drawing) was added by screen printing method, and Y-direction wirings 3, each connecting the device electrodes B of the paired device electrodes of each row, were added by screen printing method, similarly to the X-direction wirings 2. Then baking was executed to obtain the X-direction wirings 2 and the Y-direction wirings 3.

Step 3: The substrate 1 on which the X-direction wirings 2 and the Y-direction wirings 3 were formed in the step 2 was washed with deionized water.

Step 4: In aqueous solution containing polyvnyl alcohol at a concentration of 0.05 wt. %, 2-propanol at 15 wt. % and ethylene glycol at 1 wt. %, acetic acid palladium-monoethanolamine complex was dissolved so as to obtain a palladium concentration of about 0.15 wt. %, thereby obtaining pale yellow aqueous solution.

The droplets of the above-mentioned aqueous solution were deposited on the substrate by ink jet method, four times in a same spot (with a dot diameter of about 100 μm), in such a manner that the solution extends from the device electrodes A, B constituting each pair to the electrode gap therebetween.

The substrate 1 bearing the above-mentioned droplets of the aqueous solution was baked for 30 minutes in a baking oven of 350° C. to form a thin palladium film 4 connecting the above-mentioned device electrodes A, B constituting the pair between the device electrodes, and then the substrate 1 was fixed to a rear plate 5.

Step 5: The above-described rear plate was made to oppose to a face plate 10 having a phosphor film 8 and a metal back 9 formed on the internal surface of a glass substrate 7, and both were sealed by a supporting frame 6 to form an envelope 11. To the supporting frame 6, a gas feed/discharge pipe for gas feeding and discharging was connected in advance.

Step 6: After the interior of the envelope was evacuated to a pressure of 1.3×10$^{-5}$ Pa through the gas feed/discharge pipe, a voltage was applied between the paired device electrodes of the respective columns, utilizing X-direction terminals $D_{x1}$ to $D_{xn}$ respectively connected to the X-direction wirings 2 and Y-direction terminals $D_{y1}$ to $D_{yn}$ respectively connected to the Y-direction wirings 3, thereby executing a "forming operation" for generating a gap in each of the palladium film 4 between the device electrodes A, B for each line.

Step 7: After the interior of the envelope 11 was evacuated to a pressure of 1.3×10$^{-5}$ Pa, benzonitrile was introduced through the gas feed/discharge pipe until the interior of the envelope 11 reached a pressure of 1.3×10$^{-2}$ Pa, and an "activation operation" for depositing carbon in the gap of the above-mentioned palladium film was executed by supplying pair of the device electrodes with a pulsed voltage in a similar manner as in the aforementioned "forming operation". The pulsed voltage was applied for 25 minutes for each line and thus forming the substrate conduction electron-emitting devices (electron source).

Step 8: After the interior of the envelope 11 was sufficiently evacuated through the gas feed/discharge pipe, the evacuation was executed further while the entire envelope 11 was heated for 3 hours at 250° C. Finally, a getter was flushed, and the gas feed/discharge pipe was sealed off.

Figure 2:
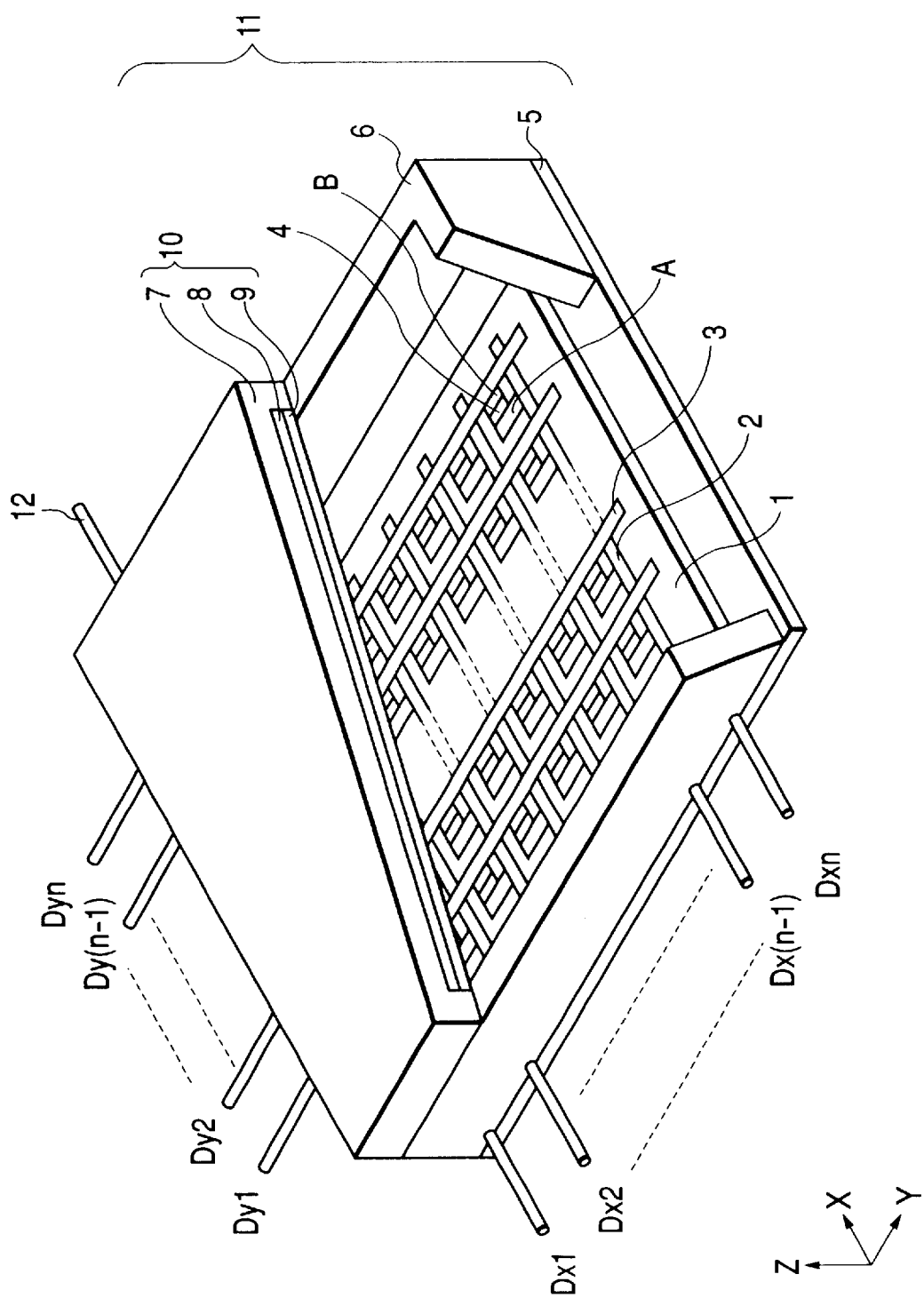
FIG. 2 is a schematic view showing a display panel portion of an image forming apparatus produced according to the example 5.

The display panel shown in FIG. 2 was produced in the above-mentioned manner, and was connected to an unrepresented drive circuit composed of a scanning circuit, a control circuit, a modulating circuit, a DC voltage source etc., thereby providing a panel-shaped image forming apparatus.

An arbitrary matrix image pattern could be displayed with satisfactory image quality, by applying a predetermined voltage to the surface conduction type electron emitting devices on time-shared basis through the X-direction terminals $D_{x1}$ to $D_{xn}$ and the Y-direction terminals $D_{y1}$ to $D_{yn}$ while applying a high voltage to the metal back 9 through a high voltage terminal 12.

The present invention explained in the foregoing provides the following advantages:

(1) it does not employ a large amount of organic solvent, thereby minimizing the detrimental effect not only on the work environment but also on the natural environment;

(2) not employing a storing acid in the patterning, it can form desired fine electrodes and/or desired wiring pattern with a high precision, without deterioration of the precision, resulting for example from the erosion of the substrate by the strong acid; and (3) the metal film formed as the electrode and/or wiring can be made uniform and of satisfactory quality, by selecting the organometallic compound (metal complex having specified ligand) which causes little crystal precipitation particularly in the drying step.

What is claimed is:

1. A composition for forming an electroconductive film comprising a water-soluble photosensitive resinous component, a water-soluble organometallic compound component capable of forming an electroconductive film by baking, and an aqueous solvent component.

2. The composition according to claim 1, wherein a water content in said aqueous solvent component is 70 wt. % or more.

3. The composition according to claim 1, wherein a water content in said aqueous solvent component is 90 wt. % or more.

4. The composition according to claim 1, wherein said aqueous solvent component consists solely of water.

5. The composition according to any of claims 1 to 4, wherein said organometallic compound component is a platinum complex.

6. The composition according to any of claims 1 to 4, wherein said organometallic compound component is a metal complex of which ligand is a nitrogen-containing compound having at least a hydroxyl group within a molecule.

7. The composition according to claim 6, wherein said nitrogen-containing compound having at least a hydroxyl group within the molecule is a nitrogen-containing compound with 8 or less carbon atoms.

8. The composition according to any of claims 1 to 4, wherein said photosensitive resinous component is insolubilized in developing liquid by light irradiation.

9. The composition according to any of claims 1 to 4, wherein said photosensitive resinous component is solubilized in developing liquid by light irradiation.

10. A method for forming an electroconductive film comprising a coating step of coating an electroconductive film forming composition according to claim 8 on a surface of a substrate, a drying step of drying a coated film of said electroconductive film forming composition, an exposure step of exposing said coated film to light of a predetermined pattern, a development step of removing a non-exposed portion of said coated film, and a baking step of baking a remaining exposed portion of said coated film.

11. The method according to claim 10, wherein said coating step is a step employing any selected from a spinner coating method, a dip coating method, a spray coating method, a stamp coating method, a roller coating method, a slit coating method and an ink jet coating method.

12. The method according to claim 10, wherein said coating step is a step employing ink jet coating method.

13. The method according to claim 10, wherein said coating step is a step employing a screen printing method, an offset printing method or a flexo printing method.

14. A method for producing an image forming apparatus comprising a plurality of electron-emitting devices including a respective electrode, wiring for driving the electron-emitting devices, and an image-forming member for forming an image in response to being irradiated by electrons emitted from the electron-emitting devices, wherein the method comprises forming at least one of the electrode and the wiring by the method for forming an electroconductive film according to claim 10.

15. A method for forming an electroconductive film comprising a coating step of coating an electroconductive film forming composition according to claim 9 on a surface of a substrate, a drying step of drying a coated film of said electroconductive film forming composition, an exposure step of exposing said coated film to light of a predetermined pattern, a development step of removing an exposed portion of said coated film, and a baking step of baking a remaining non-exposed portion of said coated film.

16. The method according to claim 15, wherein said coating step is a step employing any selected from a spinner coating method, a dip coating method, a spray coating method, a stamp coating method, a roller coating method, a slit coating method and an ink jet coating method.

17. The method according to claim 15, wherein said coating step is a step employing ink jet coating method.

18. The method according to claim 15, wherein said coating step is a step employing a screen printing method, an offset printing method or a flexo printing method.

19. A method for producing an image forming apparatus comprising a plurality of electron-emitting devices including a respective electrode, at least one wiring for driving the electron-emitting devices, and an image-forming member for forming an image in response to being irradiated by electrons emitted from the electron-emitting devices, wherein the method comprises forming at least one of the electrode and the wiring by the method for forming an electroconductive film according to claim 15.

* * * * *